United States Patent [19]
Iida et al.

[11] Patent Number: 5,410,450
[45] Date of Patent: Apr. 25, 1995

[54] INTERNAL WIRING STRUCTURE OF A SEMICONDUCTOR DEVICE

[75] Inventors: Kiyoshi Iida, Matsumoto; Hisashi Fujitaka, Kounosu, both of Japan

[73] Assignee: Fuji Electric Co., Ltd., Kawasaki, Japan

[21] Appl. No.: 985,589

[22] Filed: Dec. 3, 1992

[30] Foreign Application Priority Data

Dec. 10, 1991 [JP] Japan ................... 3-324876

[51] Int. Cl.⁶ .................... H05K 1/14; H01L 23/053
[52] U.S. Cl. ...................... 361/736; 174/52.4; 257/678; 257/668; 257/723; 361/728; 361/752; 361/813
[58] Field of Search .......... 174/50.51, 50.5, 52.1–52.4; 257/678, 693, 704, 711, 723, 668; 361/752, 760, 807, 809, 728, 736, 813

[56] References Cited

U.S. PATENT DOCUMENTS 4,819,042  4/1989  Kaufman .................. 257/678

FOREIGN PATENT DOCUMENTS

| | | |
|---|---|---|
| 0292848 | 5/1988 | European Pat. Off. . |
| 0427143 | 11/1990 | European Pat. Off. . |
| 0455322 | 2/1991 | European Pat. Off. . |
| 3516995 | 11/1985 | Germany . |
| 4031051 | 5/1991 | Germany . |
| 3-190190 | 8/1991 | Japan ................... 174/52.4 |

*Primary Examiner*—Leo P. Picard
*Assistant Examiner*—Donald A. Sparks
*Attorney, Agent, or Firm*—Brumbaugh, Graves, Donohue & Raymond

[57] ABSTRACT

External lead-through terminals of a semiconductor device, such as a power transistor module, are internally wired to a circuit assembly by a wiring block consisting of one or more conductive lead frames interposed between the lead-through terminals and the circuit assembly.

10 Claims, 3 Drawing Sheets

INTERNAL WIRING STRUCTURE OF A SEMICONDUCTOR DEVICE

BACKGROUND OF THE INVENTION

This invention relates generally to semiconductor devices and, more particularly, to the internal wiring of semiconductor devices such as a power transistor module.

Typically, a power transistor module includes a circuit assembly mounted on an insulative substrate which is enclosed in a case having a lid in the form of a terminal block through which external lead-through terminals extend and are connected to terminal connections of the circuit assembly. A typical construction of a power transistor module, illustrated in FIG. 5 without the usual case, includes a metallic substrate 1, which serves as a heat-dissipating plate and may also form the bottom of the case, on which is mounted an insulative substrate 2. Formed on the insulative substrate is a circuit assembly including conductor patterns 3 which interconnect semiconductor components including transistor chips 4 (e.g., Darlington pairs) and diodes 5. The electrodes of the transistor chips 4 are connected by bonding wires 6 to the conductor patterns 3. In the illustrated example, the equivalent circuit of which is shown in FIG. 4, two sets of semiconductor chips are connected in parallel to increase the current carrying capacity of the circuit assembly.

Connection to the circuit assembly is made via a series of main external lead-through terminals 9 and a series of auxiliary external lead-through terminals 10 which extend through an insulative terminal block 7, formed of resin, for example. The terminal block is superposed on the circuit substrate assembly and lead-through terminals 9 and 10 are soldered by means of reflow soldering to the terminal connections of the conductor patterns 3 on the substrate. The resulting assembly of the terminal block with the metallic substrate and the circuit substrate assembly is then assembled in a case, with terminal block 7 serving as the lid, and filled with a resin gel filler material to seal the case and complete the semiconductor device.

Each of the external lead-through terminals 9 and 10 on terminal block 7 is made by pressing and bending processes, with the bent tips at the inner ends all aligned in the same plane and the legs pressed into the case lid 7. Circuit locations requiring internal connection between the external lead-through terminals 9 and 10 are wired together with insulation covered leads 11.

Among the disadvantages of the internal wiring structure of the described semiconductor device is that the external lead-through terminals 9 and 10 are fabricated piece-by-piece as individual parts having different shapes, which contributes to poor material yield. In order to reliably solder the superposed terminal block 7 to the conductor patterns 3 on the circuit substrate, it is necessary for the tips of the legs of each lead-through terminal to be aligned very accurately, as the external lead-through terminals 9 and 10 are individually pressed into the case lid 8. The process control necessary to assure flatness of the finished module is complex and difficult to perform.

The use of flexible leads 11 for part of the internal wiring of the module dictates the use of tedious hand work, which is not only labor intensive but may result in inconsistencies in the length and routing of the leads which makes the semiconductor device susceptible to an induction effect from the main circuit current. Also, the hand-soldered connections may become loosened, causing undesirable oscillations and malfunction of the circuit.

A primary object of the present invention is to overcome the described problems of prior module structures and methods for their fabrication.

A more specific object is to provide an internal wiring structure for a semiconductor device which eliminates the need for internal leads that can cause oscillations and circuit malfunction.

Another object of the invention is to provide an improved internal wiring structure which simplifies the assembly, and increases the material yield, of a power transistor module.

SUMMARY OF THE INVENTION

These and other objects of the invention are achieved by an internal wiring structure which consists of a wiring block formed of resin, for example, having one or more conductive leads configured as a frame and molded in the block. The wiring block is interposed between a terminal block through which external lead-through terminals extend, and a circuit assembly supported on an insulative substrate, and interconnects each terminal connection of the circuit assembly to an appropriate external lead-through terminal. As applied to a power transistor module in which the circuit assembly embodies a main circuit and an auxiliary circuit, the resin wiring block may have two lead frames molded therein, one for making connection between terminal connections of the main circuit and respective external terminals, and the second for interconnecting terminals of the auxiliary circuit and respective external terminals. Each of the lead frames has conductive tabs extending therefrom which are cut to proper length and bent to the correct shape after they are molded into the retaining frame.

To assemble the module, appropriate tabs of the lead frame or frames of the wiring block are first bonded, as by soldering, to the inner end of the appropriate external lead-through terminals which extend through the terminal block. Then, the integral assembly of terminal block and wiring block is mounted on the circuit substrate and selected tabs of the frame(s) are soldered to appropriate terminal connections of the conductor patterns of the circuit assembly, completing the internal wiring.

Other objects, features and advantages of the invention will become apparent, and its construction and operation better understood, from the following detailed description when read in conjunction with the accompanying drawings.

DESCRIPTION OF THE PREFERRED EMBODIMENT

Figure 5:
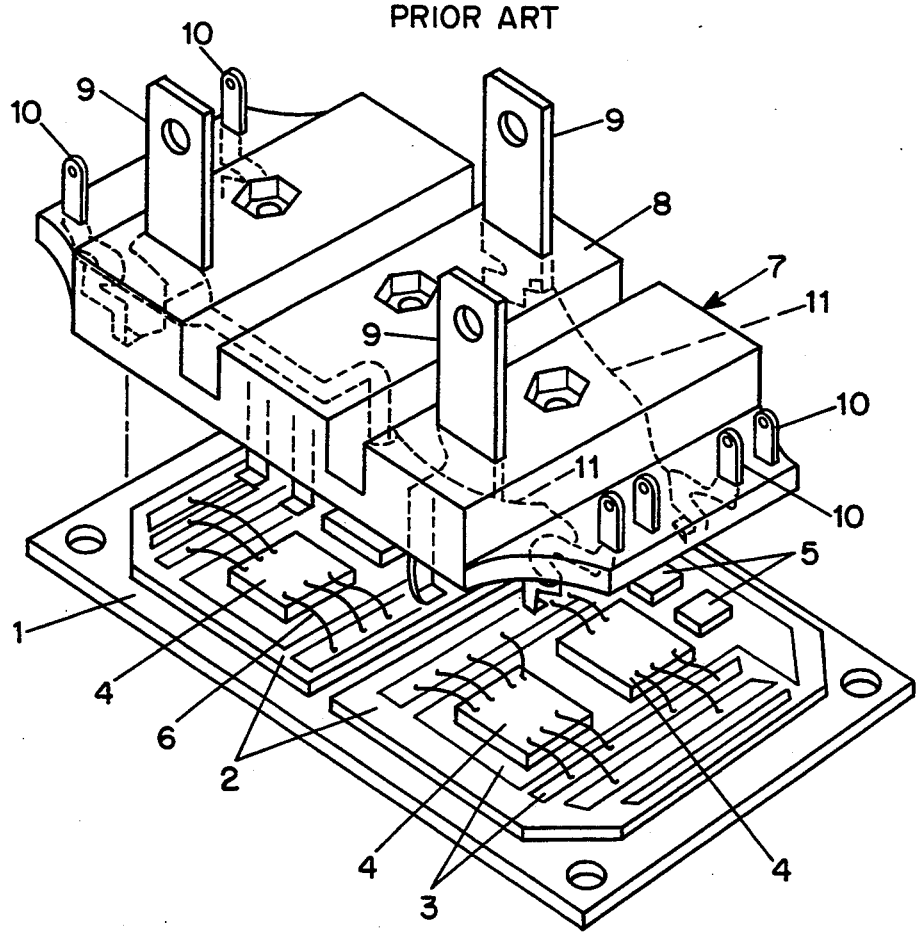
FIG. 5, to which reference has already been made, is an exploded perspective view of a prior art semiconductor device.

This invention relates generally to the internal wiring of semiconductor devices. An embodiment of the present invention for use with a power transistor module, for example, is referenced to the enclosed drawings, where parts identical with those in FIG. 5 are given the same numerals.

Figure 1:
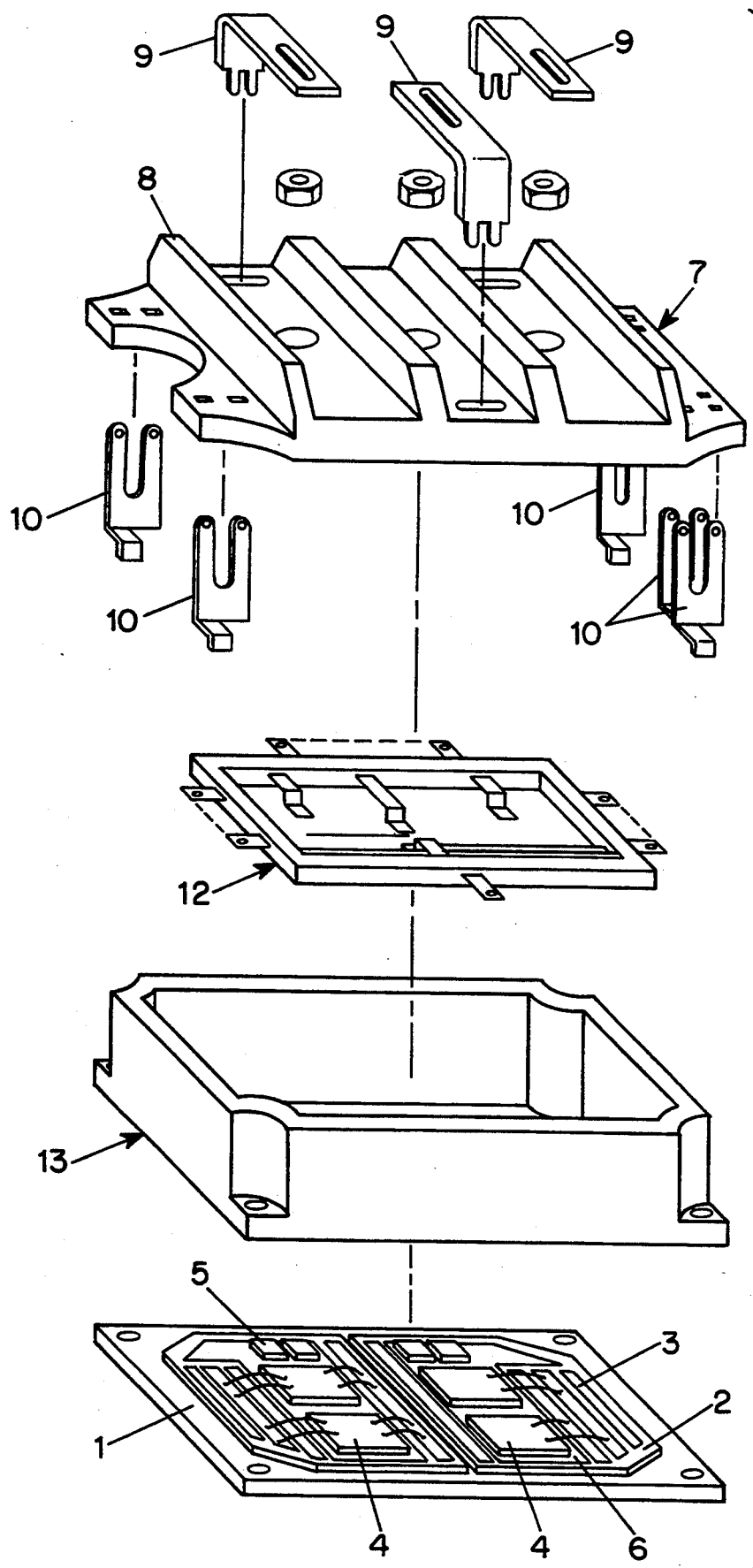
FIG. 1 is an exploded, perspective view of a semiconductor device constructed in accordance with the invention.
Figure 3:
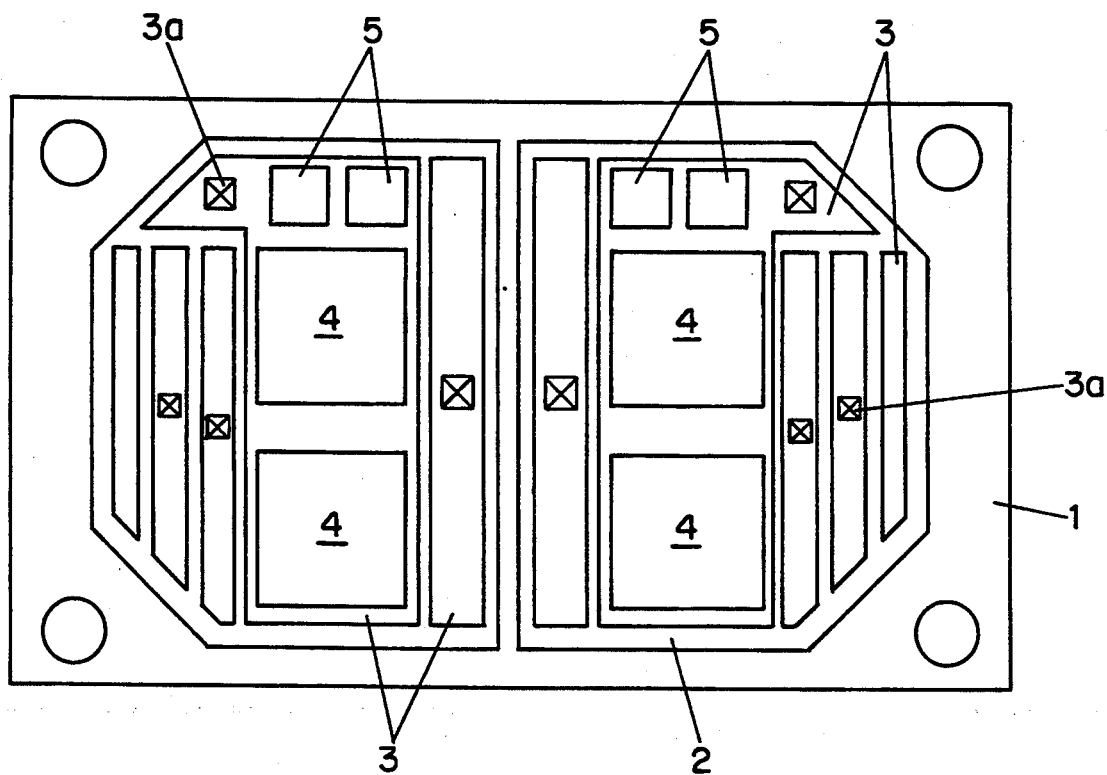
FIG. 3 is a top plan view of the circuit substrate assembly shown in FIG. 1.
Figure 4:
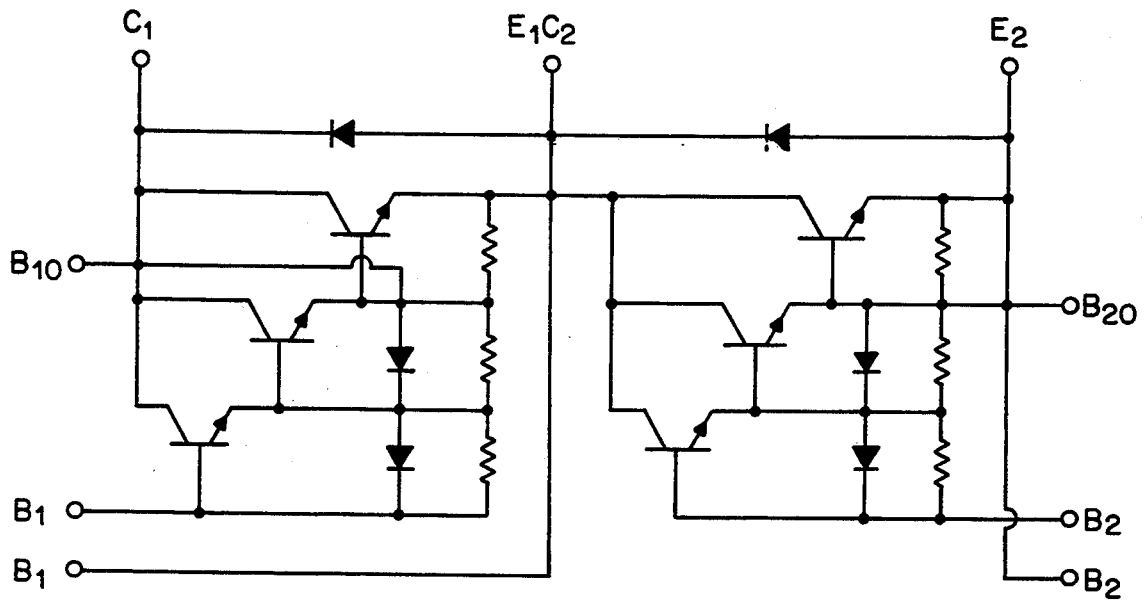
FIG. 4 is an equivalent circuit of the power transistor module shown in FIG. 5.

FIG. 1 is a perspective view of a dismantled semiconductor device, wherein a new wiring block 12 is interposed between the underside of a terminal block 7 and an assembly consisting of a circuit substrate and semiconductor chips shown in FIG. 3. This is the same configuration as shown in FIG. 5. The external lead-through terminals 9 and 10 on the terminal block 7 are internally connected to the conductor patterns 3 on the circuit substrate via said wiring block 12. The assembly is constructed with a case 13 as an enclosure to produce a semiconductor device.

Figure 2:
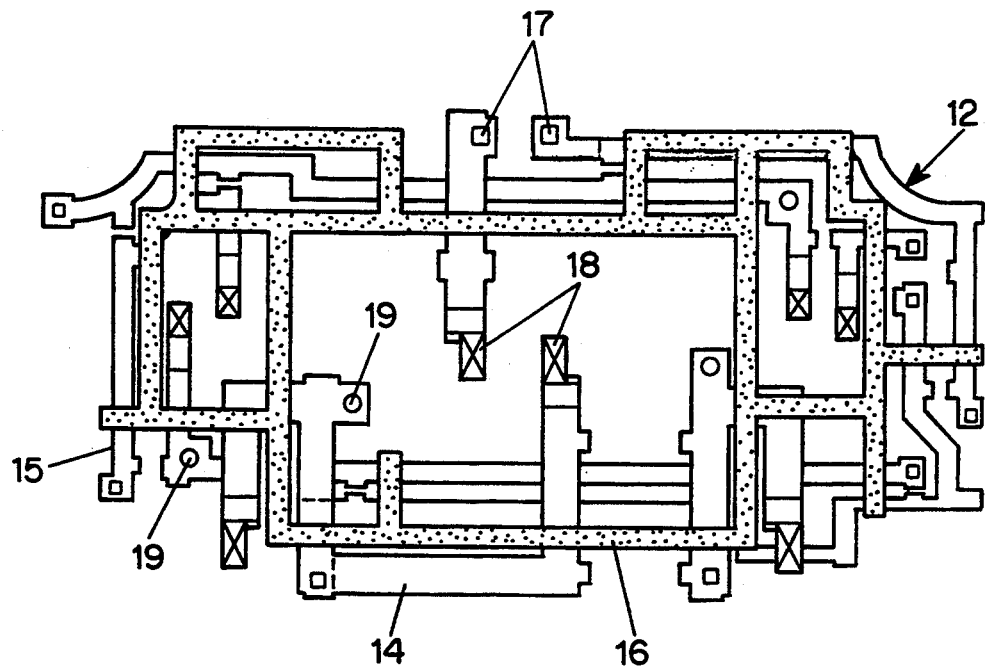
FIG. 2 is a plan view of the underside of the wiring block shown in FIG. 1.

The terminal block 7 uses identically shaped terminal parts for both the external lead-through terminals 9 on the main circuit and the external lead-through terminals 10 on the auxiliary circuit, which are then pressed into a case lid 8. At the same time, the wiring block 12, with its construction detail shown in FIG. 2, consists of a main circuit lead frame 14 and an auxiliary circuit lead frame 15 in which a series of wiring routes, divided for the main circuit and the auxiliary circuit, are pressformed on the lead frames. The retaining frame 16 is made of resin in which the lead frames 14 and 15 are laid above and below and integrally molded. In order to connect the lead frames 14 and 15 to the external lead-through terminals 9 and 10, square holes 17 are drilled and the tips of the external lead-through terminals 9 and 10 are then inserted into them. Thereafter, the connecting parts 18 shown by the mark "x" in FIG. 2, which are made with lead frames 14 and 15 and stand upright, are connected to the conductor patterns 3 on the circuit substrate at terminal connections 3a shown by mark "x" in FIG. 3. The lead cutting process is used to eliminate any unnecessary parts from the lead frames 14 and 15, and lead bending processes are carried out once the lead frames 14 and 15 are molded together and held in the retaining frame 16. Round holes 19 are drilled at several locations in the lead frames 14 and 15 allowing positioning jigs to be used in the assembly of the wiring block 12.

The above semiconductor device is assembled using the following procedure. First, the wiring block 12 is superposed over the rear side of the terminal block 7 and soldered together with the tips of the external lead-through terminals 9 and 10 inserted into the square holes 17 of the lead frames 14 and 15. Semiconductor chips are then mounted on the circuit substrate through a separate process. Next the assembly of the terminal block 7 with the wiring block 12 is mounted on an assembly of the circuit substrate and the case 13 with the wiring block 12 superposed on the conductor patterns 3 of the circuit substrate. Moreover, the terminal connections 3a in the conductor patterns 3 are bonded using a reflow soldering method with connections 18 which are formed upright on the lead frames 14 and 15. As a result, a series of internal wiring between the circuit substrate and the terminal block is formed via the lead frames 14 and 15 on the wiring block 12.

As set forth in the foregoing details of the invention, because the series of internal wiring routes interconnecting the external lead-through terminals on the terminal block with the conductor patterns on the circuit substrate are all formed on the lead framed there is no need to use additional lead wires. Moreover, both the external lead-through terminals on the main circuit and the external lead-through terminals on the auxiliary circuit are incorporated into the terminal block and do not need to be guided along the internal wiring routes. Further, the thermal stresses associated with heat cycles associated with construction can be absorbed into a lead frame made of elastic material. Therefore, terminals with a simple shape can be used as external lead-through terminals as a part serving both main and auxiliary circuits. Moreover, subjecting the main circuit lead frame and the auxiliary circuit lead frame to lead cutting and bending processes after both have been integrally molded into the retaining frame simplifies the fabrication and assembly processes, and facilitates the control of the accuracy of the flatness of the connecting parts of the terminals relative to the circuit substrate.

We claim:

1. An internal wiring structure in a semiconductor device module which includes a circuit assembly with a plurality of terminal connections supported on an insulative substrate and a terminal block having a plurality of external lead-through terminals inserted therethrough, said terminal block serving as a lid for the semiconductor device module, and each of said lead-through terminals having an inner end facing said circuit assembly, said internal wiring structure comprising:

a wiring block comprising a predetermined frame-like arrangement of conductive leads supported in a retaining frame interposed and attached between said terminal block and said circuit assembly, said conductive leads connecting said terminal connections to respective ones of said external lead-through terminals, said conductive leads having a first plurality of flat tabs extending from said retaining frame and each having a hole through which an end of a respective one of said external lead-through terminals extends, and said conductive leads having a second plurality of contoured conductive tabs which extend from said retaining frame and which precisely contact respective ones of said terminal connections of said circuit assembly.

2. The internal wiring structure as claimed in claim 1, wherein said circuit assembly includes a main circuit and an auxiliary circuit, wherein said lead-through terminals include external main circuit terminals and external auxiliary circuit terminals, wherein said arrangement of conductive leads includes first leads for connecting said main circuit to said external main circuit terminals and second leads for connecting said auxiliary circuit to said external auxiliary circuit terminals, and wherein said retaining frame is a molded resin frame in which said first and second leads are integrally molded.

3. The internal wiring structure as claimed in claim 2, wherein said arrangement of conductive leads includes a plurality of contoured conductive tabs which project from said retaining frame, each of which is shaped and dimensioned after the arrangement is molded into said retaining frame, providing precise electrical and mechanical contact between a respective lead-through terminal and a circuit terminal connection, and a plurality of flat conductive tabs which protrude horizontally from said retaining frame and which have a plurality of square holes drilled into them.

4. The internal wiring structure as claimed in claim 3, wherein said conductive leads are lead frames.

5. The internal wiring structure as claimed in claim 2, wherein said conductive leads are lead frames.

6. The internal wiring structure as claimed in claim 1, wherein said circuit assembly includes a main circuit and an auxiliary circuit, wherein said external lead-through terminals include external main circuit terminals and external auxiliary circuit terminals, wherein said arrangement of conductive leads includes first leads four connecting said main circuit to said external main circuit terminals and second leads for connecting said auxiliary circuit to said external auxiliary circuit terminals, and wherein said retaining frame is a molded resin frame in which said first and second leads are integrally molded.

7. The internal wiring structure as claimed in claim 6, wherein said conductive leads are lead frames.

8. The internal wiring structure as claimed in claim 1, wherein at least one of said contoured conductive tabs is formed by bending a small length of the tip of the tab to an angle perpendicular to the retaining frame and in a direction towards the circuit assembly, and then bending an even smaller length of the tip of the tab to an angle parallel to the retaining frame such that the overall contour is similar to the letter "z".

9. The internal wiring structure as claimed in claim 8, wherein said conductive leads are lead frames.

10. The internal wiring structure as claimed in claim 1, wherein said conductive leads are lead frames.

* * * * *

UNITED STATES PATENT AND TRADEMARK OFFICE
CERTIFICATE OF CORRECTION

PATENT NO. : 5,410,450
DATED : April 25, 1995
INVENTOR(S) : Iida et al.

It is certified that error appears in the above-indentified patent and that said Letters Patent is hereby corrected as shown below:

Column 4, line 3,     "framed" should read --frame,--;

Column 5, line 14,     "four connecting" should read --for

Signed and Sealed this

Eighth Day of August, 1995

Attest:

BRUCE LEHMAN

Attesting Officer     *Commissioner of Patents and Trademarks*